(12) United States Patent
Brodsky (10) Patent No.: US 7,824,846 B2
(45) Date of Patent: Nov. 2, 2010

(54) TAPERED EDGE BEAD REMOVAL PROCESS FOR IMMERSION LITHOGRAPHY

(75) Inventor: Colin J. Brodsky, Salt Point, NY (US)

(73) Assignee: International Business Machines Corporation, Armonk, NY (US)

( * ) Notice: Subject to any disclaimer, the term of this patent is extended or adjusted under 35 U.S.C. 154(b) by 513 days.

(21) Appl. No.: 11/857,764

(22) Filed: Sep. 19, 2007

(65) Prior Publication Data

US 2009/0075217 A1   Mar. 19, 2009

(51) Int. Cl.
*G03F 7/26* (2006.01)
(52) U.S. Cl. ...................................... 430/327
(58) Field of Classification Search .......... 430/311, 430/331, 322, 329, 396, 394, 397, 327
See application file for complete search history.

(56) References Cited

U.S. PATENT DOCUMENTS

2005/0255702 A1 * 11/2005 Honeycutt et al. .......... 438/725

2007/0003879 A1   1/2007 Chang et al.

* cited by examiner

*Primary Examiner*—Kathleen Duda
*Assistant Examiner*—Caleen O Sullivan
(74) *Attorney, Agent, or Firm*—Schmeiser, Olsen & Watts; Ian D. MacKinnon (57) ABSTRACT

A method and apparatus for forming a tapered photoresist edge. The method includes: forming a photoresist layer on a substrate; exposing a first annular region of the photoresist layer adjacent to a perimeter of the substrate to actinic radiation, the first annular region having a first outer perimeter proximate to a perimeter of the substrate and a first inner perimeter away from the perimeter of the substrate, the actinic radiation gradually decreasing in intensity from the first outer perimeter to the first inner perimeter; and developing the exposed first annular region of the photoresist layer to form a tapered profile in a second annular region of the photoresist layer, the second annular region having a second perimeter proximate to the perimeter of the substrate and a second inner perimeter away from the substrate perimeter, the profile gradually increasing in thickness from the second outer perimeter to the second inner perimeter.

16 Claims, 6 Drawing Sheets

TAPERED EDGE BEAD REMOVAL PROCESS FOR IMMERSION LITHOGRAPHY

FIELD OF THE INVENTION

The present invention relates to the field of integrated circuit fabrication; more specifically, it relates to a method and apparatus for forming a photoresist layer with a tapered edge for use in immersion photolithography.

BACKGROUND OF THE INVENTION

Photolithography is a technique by which a pattern on a photomask is projected through a lens onto a photoresist layer on a substrate such as a semiconductor substrate. After a subsequent development cycle the pattern on the photomask is transferred to the photoresist layer. Conventional photolithography is unable to produce the smallest of the photoresist images sizes that current integrated circuit designs call for. Immersion lithography utilizes an immersion fluid placed between the lens and the photoresist layer. This increases the numerical aperture of the exposure system and improves depth of focus and resolution. However, immersion photolithography has been found to have defect generation mechanisms not found in conventional lithography. Accordingly, there exists a need in the art for improved immersion lithography processes that overcome immersion lithography related defect mechanisms.

SUMMARY OF THE INVENTION

A first aspect of the present invention is a method, comprising: forming a photoresist layer on a substrate; exposing a first annular region of the photoresist layer immediately adjacent to a perimeter of the substrate to actinic radiation, the first annular region having a first outer perimeter proximate to a perimeter of the substrate and a first inner perimeter away from the perimeter of the substrate, the actinic radiation gradually decreasing in intensity from the first outer perimeter to the first inner perimeter; developing the exposed first annular region of the photoresist layer to form a tapered profile in a second annular region of said photoresist layer, the second annular region having a second outer perimeter proximate to the perimeter of the substrate and a second inner perimeter away from the perimeter of the substrate, the profile gradually increasing in thickness from the second outer perimeter to the second inner perimeter; and after the developing, no portion of the photoresist layer remaining on the substrate between the second outer perimeter and the perimeter of the substrate.

A second aspect of the present invention is a method, comprising: forming a photoresist layer on a substrate by spin application of a photoresist material; rotating the substrate while exposing the photoresist layer to a spot of actinic radiation placed proximate to a perimeter of the substrate to form an exposed annular region of the photoresist layer immediately adjacent to the perimeter of the substrate, the exposed annular region having a first outer perimeter proximate to the perimeter of the substrate and a first inner perimeter away from the perimeter of the substrate, the spot of actinic radiation gradually decreasing in intensity from a region of the spot of actinic radiation nearest to the perimeter of the substrate to a region of the spot of actinic radiation nearest a center of the substrate; after the exposing, rotating the substrate while spraying a stream of developer onto the perimeter of the substrate to form a tapered profile in a tapered annular region in the photoresist layer, the tapered annular region having a second outer perimeter proximate to the perimeter of the substrate and a second inner perimeter away from the perimeter of the substrate, the profile gradually increasing in thickness from the second outer perimeter to the second inner perimeter; and after the developing, no portion of the photoresist layer remaining on the substrate between the second outer perimeter and the perimeter of the substrate.

A third aspect of the present invention is an apparatus, comprising: a rotatable wafer chuck; a spot exposure source positioned over a first peripheral region of the wafer chuck, the spot exposure source capable of directing a beam of radiation toward a less than whole portion of the wafer chuck proximate to a perimeter of the wafer chuck, the beam of radiation having a graded intensity that gradually decreases from a region of the spot nearest to the perimeter of the wafer chuck to a region of the spot nearest a center of the wafer chuck; and a spot develop spray head positioned over a second peripheral region of the wafer chuck, the spot develop spray head capable of directing a localized stream of developer toward a less than whole portion of the wafer chuck proximate to the perimeter of the wafer chuck.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1A:
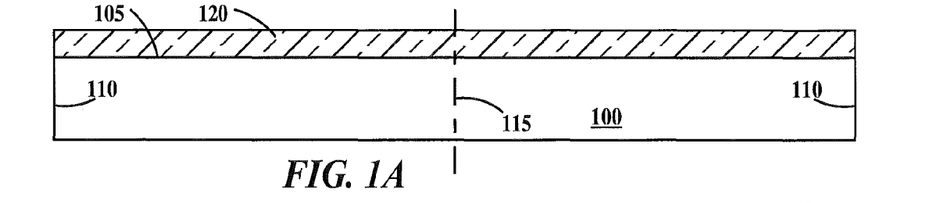
FIGS. 1A through 1D are cross-sectional drawings illustrating formation of a photoresist layer with a tapered edge according to the present invention.

FIGS. 1A through 1D are cross-sectional drawings illustrating formation of a photoresist layer with a tapered edge according to the present invention. In FIG. 1A, a circular substrate has a top surface 105, an edge 110 and a central axis 115. Central axis 115 is perpendicular to top surface 105 of substrate 100. In one example, substrate 100 is a semiconductor substrate, examples of which include, but are not limited to single-crystal bulk silicon substrates and silicon-on-insulator (SOI) substrates. Circular semiconductor substrates are also called wafers. Substrate 100 is advantageously a wafer having a diameter of between about 100 mm and about 300 mm. However, the present invention may be practiced on other shaped substrates, such a rectangular substrates. In one example, substrate 100 is a circular or rectangular glass or quartz substrate. Formed on top surface 105 is a photoresist layer 120. Photoresist layer 120 is formed by spin application. Photoresist is generally comprised of a polymer, a sensitizer and a casting solvent. In one example photoresist layer 120 is a chemically-amplified positive tone resist. A positive tone resist is made soluble in a developer by exposure to actinic radiation (e.g., 193 nm ultraviolet light). By contrast, a negative tone resist is made insoluble in a developer by exposure to actinic radiation. In one example, photoresist layer is between about 150 nm and about 250 nm thick. After spin application, photoresist layer 120 may be heated to a temperature above room temperature to drive out any remaining casting solvent. This is called a "pre-bake" or "soft-bake" and is optional.

Because of the dynamics of spin application (depositing a puddle of photoresist in the center of a substrate and spinning the substrate to spread out the photoresist into a thin layer) a bead of photoresist is formed proximate to the edge of the substrate. This bead of photoresist is thicker than the rest of the photoresist layer and can cause process control problems as well as induce defects. Therefore, various edge bead removal processes have been developed. All these processes remove the photoresist from a ring proximate to the edge of the substrate. However, the newly formed edge of the photoresist is vertical (i.e., perpendicular relative to the top surface of the substrate). The Inventor has found that during immersion lithography, as the immersion head translates across the vertical edge of the photoresist, chips of the photoresist are removed from the photoresist edge and deposited on the top surface of the photoresist layer where they subsequently cause printing defects. The Inventor believes one possible defect mechanism is that impact of the immersion fluid on the vertical sidewall of the photoresist layer generates shock waves in the immersion fluid as the substrate bearing the photoresist layer is moved while in contact with the immersion fluid, which cause the photoresist edge chipping. The present invention reduces or eliminates this problem by forming a tapered photoresist edge which is less susceptible to immersion fluid impact damage.

Figure 1B:
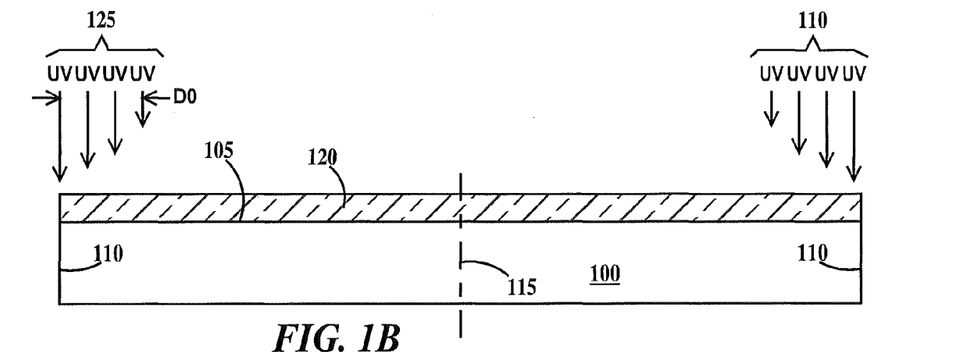

In FIG. 1B, the photoresist proximate to edge 110 of substrate 100 is exposed to actinic radiation (e.g., ultraviolet light) 125 while the substrate is rotated about central axis 115. This is called an edge bead exposure. Alternatively, the ultraviolet light could be rotated and the wafer not rotated. The ultraviolet light gradually decreases in intensity from edge 110 toward center axis 115 of substrate 100. The exposure extends a distance D0 from edge 110 toward center axis 115 of wafer 100. In one example, D0 is between about 2 millimeters (mm) to about 6 mm. In one example, substrate 100 is rotated at between about 100 and about 1000 RPM during the edge bead exposure.

Figure 1C:
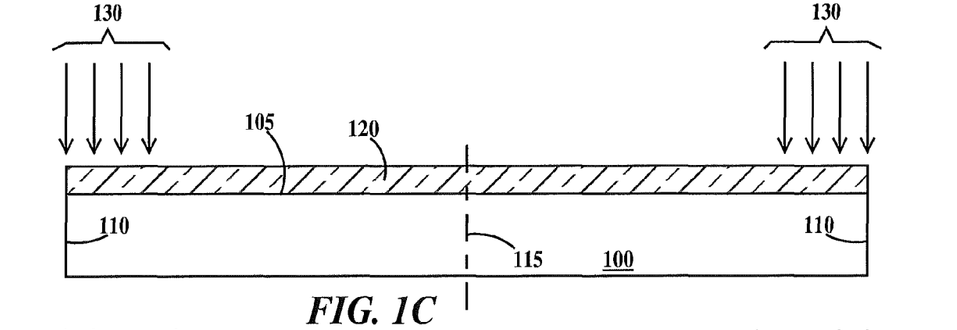

In FIG. 1C, a spray of developer solution 130 is directed onto the exposed region of photoresist layer 120 proximate to edge 110. This is called an edge bead development. In one example, the developer is diluted to about 10% of a concentration that will be used to develop a device pattern in the remainder of photoresist layer 120 after an immersion lithography step. See FIG. 7B and description infra. One exemplary developer is aqueous tetramethylammonium hydroxide (TMAH). A dilute edge bead developer (compared to the device pattern developer) has the advantage of being less likely to leach photoresist components from the regions of photoresist layer adjacent to tapered edge region 135, though the same developer may be used for both. In one example, substrate 100 is rotated at between about 100 and about 1000 RPM during the edge bead development.

Figure 1D:
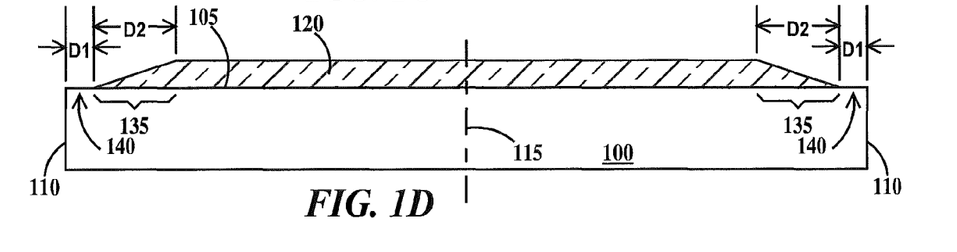

In FIG. 1D, after the edge bead development step of FIG. 1C, a tapered edge region 135 of photoresist layer 120 is formed. A peripheral region 140 of substrate 100 is also exposed. Peripheral region 140 has a width D1 measured from edge 110 of substrate 100 and tapered edge region 135 has a width D2 measured from peripheral region 140 toward central axis 115. In one example, D1 is between about 1 mm and about 3 mm. In one example, D2 is between about 1 mm and about 3 mm. In FIG. 1D, by way of example, tapered edge region 135 is uniformly (linearly) tapered. Alternatively, the soft-bake described supra, or another soft-bake may be performed after the edge bead development step, to further "smooth" tapered edge region 135.

Figure 2A:
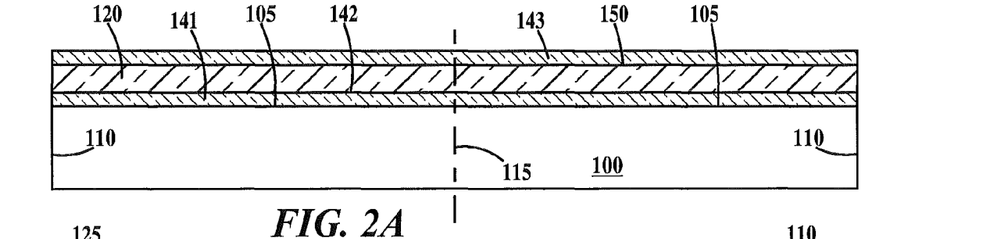
FIGS. 2A through 2D are cross-sectional drawings illustrating formation of a photoresist layer between antireflective coatings and having a tapered edge according to the present invention.
Figure 2B:
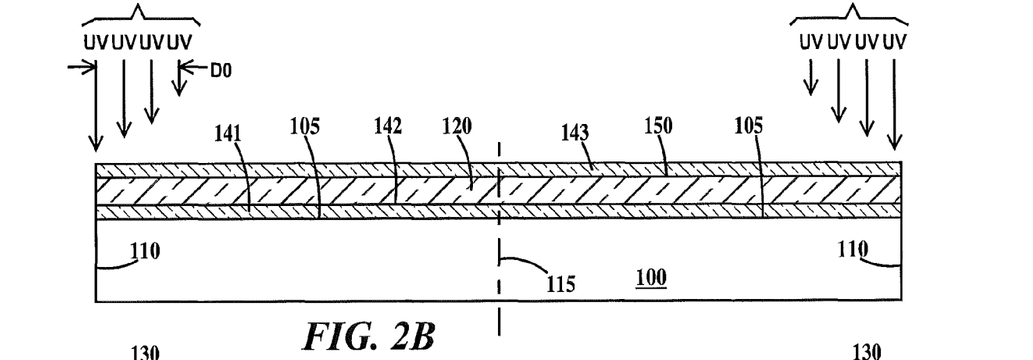
Figure 2C:
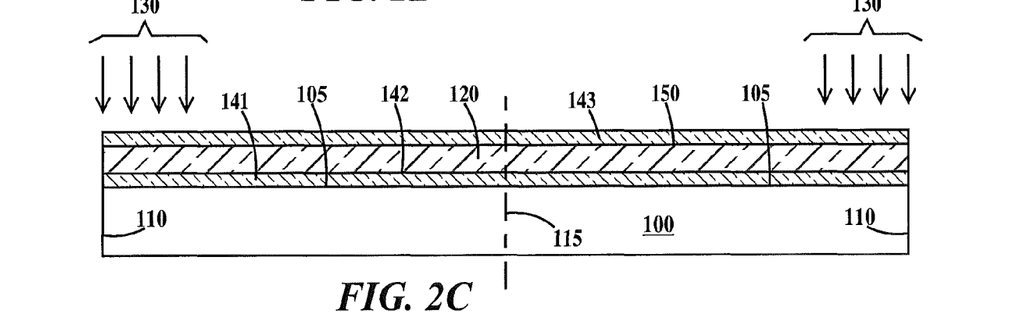
Figure 2D:
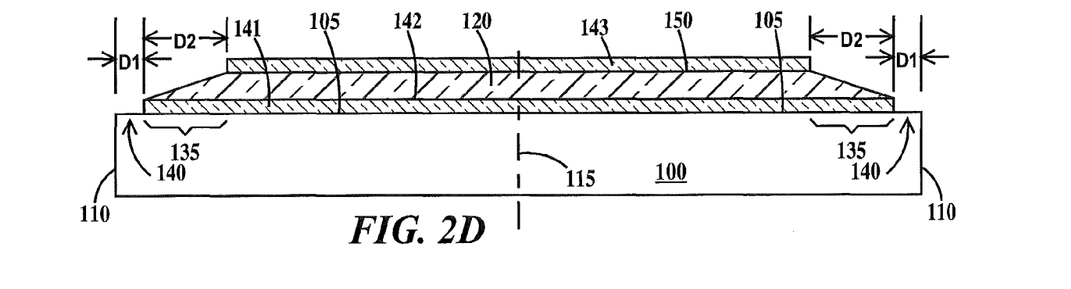

FIGS. 2A through 2D are cross-sectional drawings illustrating formation of a photoresist layer between antireflective coatings and having a tapered edge according to the present invention. FIGS. 2A through 2D are similar, respectively, to FIGS. 1A through 1D except that a bottom antireflective coating (BARC) 141 is formed on top surface 105 of substrate 100, photoresist layer 120 is formed on a top surface 142 of BARC 141 and a top antireflective coating (TARC) 143 is formed on a top surface 150 of photoresist layer 120. BARC 141 and TARC 143 may be formed by spin application. In one example, a soft-bake as described supra is performed after formation of TARC 143. In one example both BARC 141 and TARC 143 are organic materials between about 100 nm to about 200 nm thick. In one example, BARC 141 comprises an under-layer (on substrate 100) and a silicon containing layer on top of the under-layer. In one example, either or both of BARC 141 and TARC 143 are photosensitive. Alternatively only BARC 141 and photoresist layer 120 is formed in FIG. 2A. Alternatively, only photoresist layer 120 and TARC 143 is formed in FIG. 2A. In FIG. 2D, BARC 141 extends only to peripheral region 140 and TARC 143 extends only to tapered edge region 135.

Figure 3A:
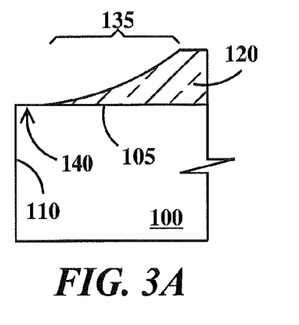
FIG. 3A through 3C are cross-sectional drawings illustrating alternative edge bead profiles for the photoresist layer of FIG. 1D.
Figure 3B:
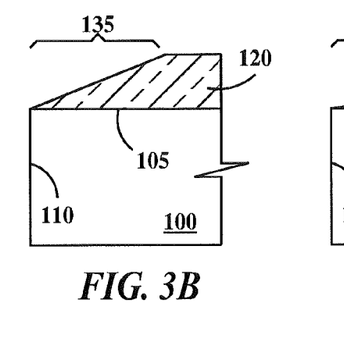
Figure 3C:
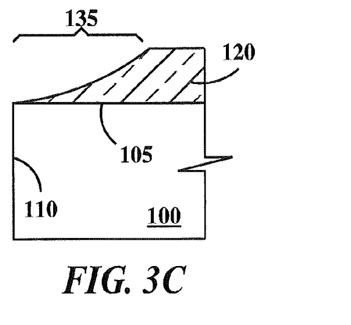

FIG. 3A through 3C are cross-sectional drawings illustrating alternative edge bead profiles for the photoresist layer of FIG. 1D. In FIG. 3A, tapered edge region 135 is concave. In FIG. 3B, tapered edge region 135 is linearly tapered and extends to edge 110 of substrate 100 (i.e., D1 of FIG. 1D is about zero). In FIG. 3C, tapered edge region 135 is concave and extends to edge 110 of substrate 100 (i.e., D1 of FIG. 1D is about zero).

Figure 4A:
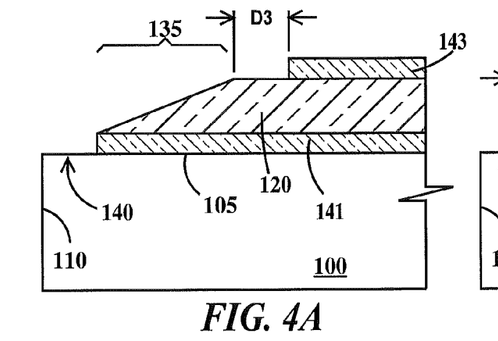
FIGS. 4A and 4B are cross-sectional drawings illustrating alternative edge bead profiles for the photoresist layer of FIG. 2D.
Figure 4B:
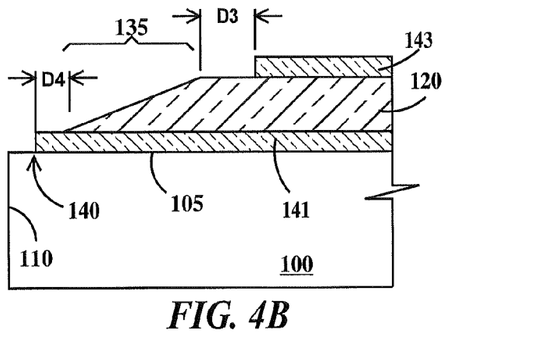

FIGS. 4A and 4B are cross-sectional drawings illustrating alternative edge bead profiles for the photoresist layer of FIG. 2D. In FIG. 4A, TARC 143 is separated from tapered edge region of photoresist layer 120 by a distance D3. In FIG. 4B, TARC 143 is separated from tapered edge region of photoresist layer 120 by a distance D3 and BARC 141 extends a distance D4 into peripheral region 140. In one example D3 is zero and D4 is not zero. In one example D4 is equal to D1 (see FIG. 2D) and D3 is zero. In one example D4 is equal to D1 (see FIG. 2D) and D3 is not zero.

Figures 5A, 5B:
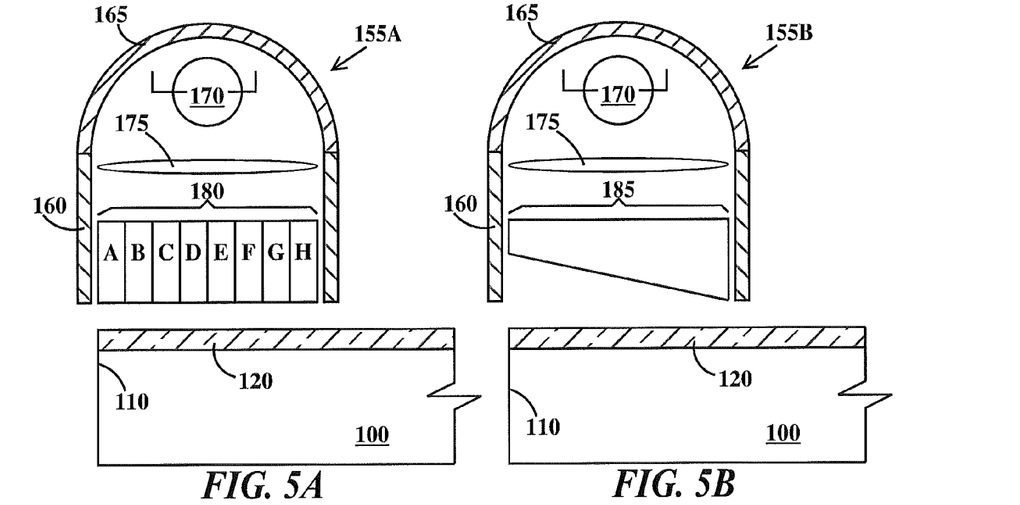
FIG. 5A is a schematic diagram of an first apparatus and FIG. 5B is a schematic diagram of a second apparatus for generating a graded exposure for use with positive tone photoresists according to an embodiment of present invention.

FIG. 5A is a schematic diagram of a first apparatus and FIG. 5B is a schematic diagram of a second apparatus for generating a graded exposure for use with positive tone photoresists according to an embodiment of the present invention. In FIG. 5A, an edge bead exposure head 155A includes a housing 160 (which also acts as a collimator), a reflector 165, an ultraviolet light source 170 (which may be a simple mercury arc lamp), an optional lens 175 and a graded density filter 180. Graded density filter 180 comprises bands of neutral density filters A through H arranged with band A nearest edge 110 and band H furthest from edge 110. The optical density of band A is less than the optical density of band B which is less than the optical density of band C though to the optical density of band G which is less than the optical density of band H. Thus, progressively less ultraviolet light is transmitted through graded density filter 180 from edge 110 in a direction from edge 110 toward the center of substrate 100. Edge bead exposure heads 155A and 155B are essentially for use with positive tone photoresists. Edge bead heads 225A and 225B of FIGS. 8A and 8B described infra are used with negative tone photoresists.

FIG. 5B is similar to FIG. 5A except an edge bead exposure head 155B includes a filter 185 formed of uniform optical density material but of varying thickness. Filter 185 is thinnest over edge 110 and increases in thickness toward the center of substrate 100 in a direction from edge 110 toward the center of substrate 100. Thus, progressively less ultraviolet light is transmitted through graded density filter 185 from edge 110 in a direction from edge 110 toward the center of substrate 100. In one example, graded density filter 185 has the shape of a wedge prism or an obliquely truncated cylinder or cone.

Figure 6A:
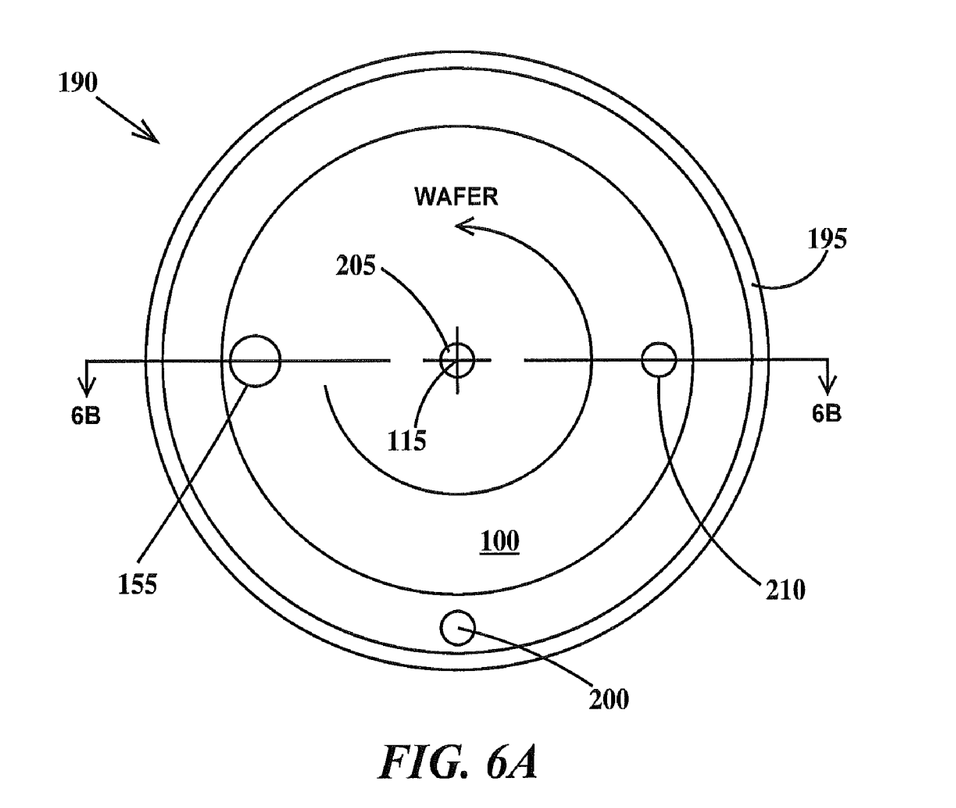
FIG. 6A is a top view and FIG. 6B is a cross-sectional view through line 6B-6B of FIG. 6A illustrating an exemplary apparatus for practicing the present invention.
Figure 6B:
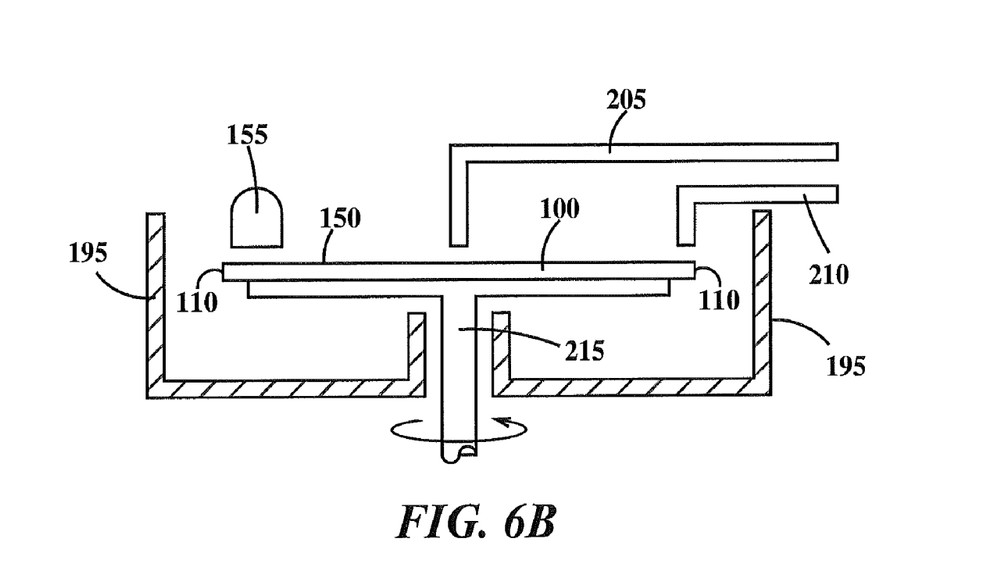

FIG. 6A is a top view and FIG. 6B is a cross-sectional view through line 6B-6B of FIG. 6A illustrating an exemplary apparatus for practicing the present invention. In FIG. 6A, an edge bead removal tool 190 includes a bowl shaped body 195, a drain 200 in the bottom of the body, a rinse nozzle 205, a spot developer spray nozzle 210, a wafer chuck 215 rotatable about a central axis and an edge bead exposure head 155 that generates a spot of ultraviolet light. Edge bead exposure head 155 is similar to edge bead exposure heads 155A of FIG. 5A or 155B of FIG. 5B or another type of graded ultraviolet exposure source that generates more light away from the center axis of chuck 215 and gradually less light toward the center axis of the chuck. Edge bead exposure head 155 and spot develop spray nozzle 210 are positioned over the periphery of substrate 100 mounted on wafer chuck 215. The term spot is defined to mean limited to a small area relative to an entire area. For example, edge bead exposure head 155 generates a spot of graded intensity ultraviolet light of between about 1 mm and about 3 mm in diameter, which is a very small area of a wafer (e.g. substrate 100) having a diameter between about 100 mm to about 300 mm.

In use, a photoresist-coated substrate 100 (may also have BARC and TARC layers) is placed on chuck 215 and the chuck rotation started. Ultraviolet exposure source 155 is turned on for a first preset duration of time and then turned off. Next developer solution is dispensed from develop dispense nozzle 210 on top surface 150 of photoresist layer (or a top surface of a TARC layer) proximate to the edge of substrate 110. After a second preset duration of time, the developer is turned off and a rinse fluid dispensed from rinse nozzle 205 for a third present duration of time. Examples of rinse fluids include, water, alcohols, nitrogen and air. Two or more rinse fluids may be dispensed in sequence. Then rotation of chuck 215 is stopped and substrate 100 removed.

Figure 7A:
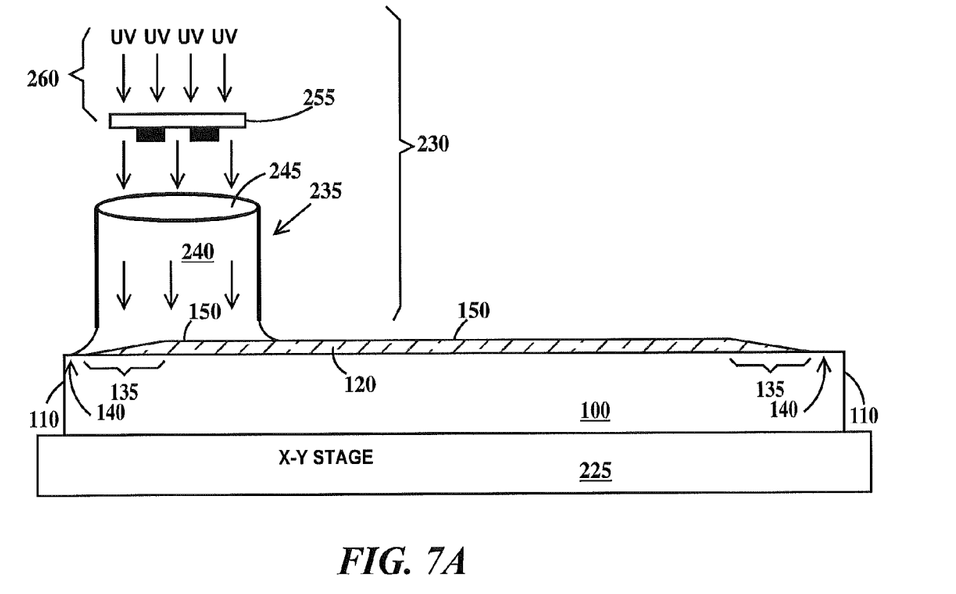
FIGS. 7A and 7B are cross-sectional drawing illustrating formation of photoresist images by immersion lithography according to the present invention.
Figure 7B:
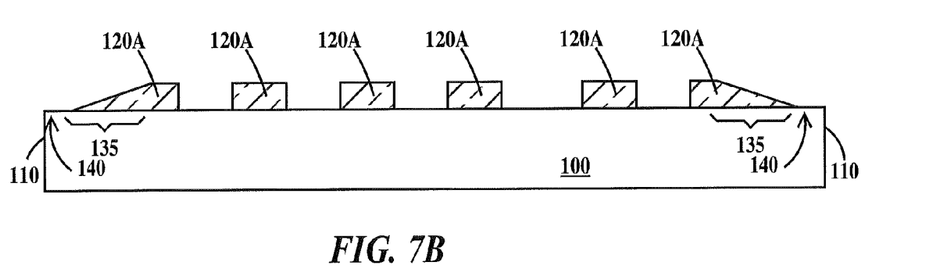

FIGS. 7A and 7B are cross-sectional drawing illustrating formation of photoresist images by immersion lithography according to the present invention. FIGS. 7A and 7B continue from FIG. 1D. Alternatively, FIGS. 7A and 7B may continue from FIG. 2D with BARC and/or TARC layers. In FIG. 7A, a substrate 100 having photoresist layer 120 with a tapered edge region 135 is placed on an X-Y stage 225 and placed under an exposure system 230. Exposure system 230 includes an immersion head 235 filled with an immersion fluid 240, a lens 245 disposed between immersion fluid 240 and a photomask 255, and a ultraviolet light source 260 positioned to project ultraviolet light through photomask 255 onto lenses 245 which in turns focuses the ultraviolet light on top surface 150 of photoresist layer 120. Photomask 255 has a pattern of transparent and opaque regions on a surface of the photomask. Immersion fluid 240 contacts a bottom surface of lens 245 and top surface 150 of photoresist layer 120. In one example, immersion fluid 240 comprises water.

In use, X-Y stage positions different regions of substrate 100 under immersion head 235 moving the wafer 100 and the reticle 255 in a synchronized operation while irradiating with ultraviolet light. The process is continued until the entire photoresist layer has been exposed. In some cases, the exposure is performed through a moving slit synchronized with the movement of wafer 100 so as to expose only regions of reticle 255 at any one time. This is known as step and scan immersion lithography. Immersion fluid 240 will pass over tapered edge region 135 of photoresist layer 120 multiple times with many different entry points onto the wafer.

In FIG. 7B, photoresist layer 120 (see FIG. 7A) is developed to generate a pattern of photoresist islands 120A in the same pattern as opaque regions on photomask 255 if photoresist layer 120 (see FIG. 7A) is a positive photoresist or in the same pattern as clear regions on photomask 255 if photoresist layer 120 (see FIG. 7A) is a negative photoresist. After development, photoresist islands 120A may be optionally heated to a temperature above room temperature to cure (e.g. cross-link or further polymerize) the polymers in the photoresist islands. Note, there may also be a post-exposure and pre-development bake performed at a temperature above room temperature to enhance latent image formation in photoresist layer formed from chemically amplified photoresist formulations.

Figure 8A:
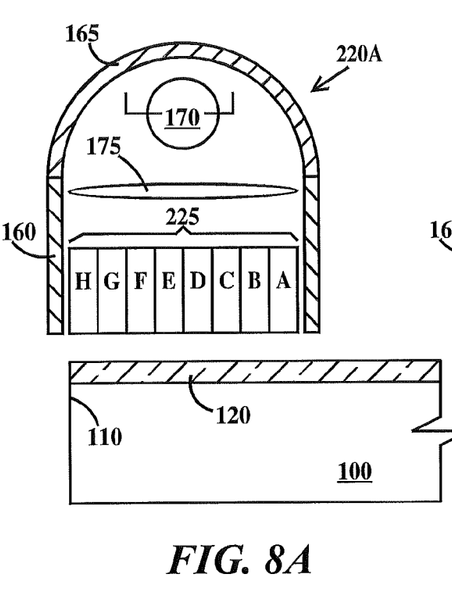
FIG. 8A is a schematic diagram of an first apparatus and FIG. 8B is a schematic diagram of a second apparatus for generating a graded exposure for use with negative tone photoresists according to an embodiment of the present invention.
Figure 8B:
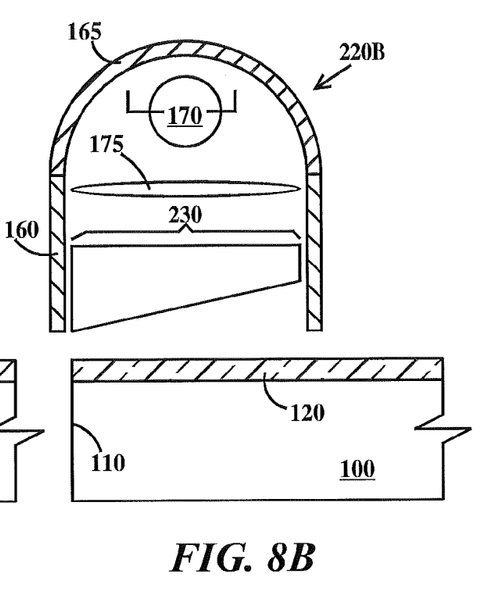

FIG. 8A is a schematic diagram of an first apparatus and FIG. 8 is a schematic diagram of a second apparatus for generating a graded exposure for use with negative tone photoresists according to an embodiment of the present invention. In FIG. 8A, an edge bead exposure head 220A is similar to edge bead exposure head 155A of FIG. 5A except graded density filter 180 is replaced with a graded density filter 225. Graded density filter 225 comprises bands of neutral density filters A through H arranged with band H nearest edge 110 and band A furthest from edge 110. The optical density of band A is less than the optical density of band B which is less than the optical density of band C though to the optical density of band G which is less than the optical density of band H.

In FIG. 8A, an edge bead exposure head 220B is similar to edge bead exposure head 155B of FIG. 5A except filter 185 is replaced with a filter 220. Filter 230 is formed of uniform optical density material but of varying thickness. Filter 230 is thickest over edge 110 and decreases in thickness toward the center of substrate 100 in a direction from edge 110 toward the center of substrate 100.

Thus, the embodiments of the present invention provide an improved immersion lithography processes that overcomes immersion lithography unique defect mechanisms.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method, comprising:
    forming a photoresist layer on a substrate;
    exposing a first annular region of said photoresist layer immediately adjacent to a perimeter of said substrate to actinic radiation, said first annular region having a first outer perimeter proximate to a perimeter of said substrate and a first inner perimeter away from said perimeter of said substrate, said actinic radiation gradually decreasing in intensity from said first outer perimeter to said first inner perimeter;
    developing said exposed first annular region of said photoresist layer to form a tapered profile in a second annular region of said photoresist layer, said second annular region having a second outer perimeter proximate to said perimeter of said substrate and a second inner perimeter away from said perimeter of said substrate, said profile gradually increasing in thickness from said second outer perimeter to said second inner perimeter; and
    after said developing, no portion of said photoresist layer is remaining on said substrate between said second outer perimeter and said perimeter of said substrate.

2. The method of claim 1, wherein said first annular region has a width measured in a direction from said perimeter of said substrate toward a center of said substrate of between about 1 mm and about 3 mm.

3. The method of claim 1, wherein said second annular region has a width measured in a direction from said perimeter of said substrate toward a center of said substrate of between about 1 mm and about 3 mm.

4. The method of claim 1, wherein said second annular region has a width measured in a direction from said perimeter of said substrate toward a center of said substrate of between about 1 mm and about 3 mm and said second outer perimeter is between about 1 mm and about 3 mm from said perimeter of said substrate.

5. The method of claim 1, further including:
    forming a bottom antireflective coating on said substrate before said forming said photoresist layer.

6. The method of claim 1, further including:
    forming a top antireflective coating on said photoresist layer before said exposing.

7. The method of claim 1, further including:
    after said developing said exposed first annular region, placing said photoresist layer in contact with an immersion fluid and exposing said photoresist layer to actinic radiation through a patterned photomask, said immersion fluid contacting said second annular region during said exposing said photoresist layer to actinic radiation through said patterned photomask; and
    performing an additional developing of said photoresist layer to transfer a pattern on said patterned photomask to said photoresist layer by removal of regions of said photoresist layer.

8. The method of claim 7, said exposing said photoresist layer to actinic radiation through a patterned photomask includes:
    moving said substrate and said photoresist layer relative to an exposure slit while said photoresist layer is in contact with said immersion fluid, said exposure slit between said photomask and said photoresist layer.

9. A method, comprising:
    forming a photoresist layer on a substrate by spin application of a photoresist material;
    rotating said substrate while exposing said photoresist layer to a spot of actinic radiation placed proximate to a perimeter of said substrate to form an exposed annular region of said photoresist layer immediately adjacent to said perimeter of said substrate, said exposed annular region having a first outer perimeter proximate to said perimeter of said substrate and a first inner perimeter away from said perimeter of said substrate, said spot of actinic radiation gradually decreasing in intensity from a region of said spot of actinic radiation nearest to said perimeter of said substrate to a region of said spot of actinic radiation nearest a center of said substrate;
    after said exposing, rotating said substrate while spraying a stream of developer onto said perimeter of said substrate to form a tapered profile in a tapered annular region in said photoresist layer, said tapered annular region having a second outer perimeter proximate to said perimeter of said substrate and a second inner perimeter away from said perimeter of said substrate, said profile gradually increasing in thickness from said second outer perimeter to said second inner perimeter; and
    after said developing, no portion of said photoresist layer is remaining on said substrate between said second outer perimeter and said perimeter of said substrate.

10. The method of claim 9, wherein said exposed annular region has a width measured in a direction from said perimeter of said substrate toward said center of said substrate of between about 1 mm and about 3 mm.

11. The method of claim 9, wherein said tapered annular region has a width measured in a direction from said perimeter of said substrate toward said center of said substrate of between about 1 mm and about 3 mm.

12. The method of claim 9, wherein said tapered annular region has a width measured in a direction from said perimeter of said substrate toward said center of said substrate of between about 1 mm and about 3 mm and said second outer perimeter is between about 1 mm and about 3 mm from said perimeter of said substrate.

13. The method of claim 9, further including:
    forming a bottom antireflective coating on said substrate before said forming said photoresist layer.

14. The method of claim 9, further including:
    forming a top antireflective coating on said photoresist layer before said exposing.

15. The method of claim 9, further including:
    after said developing, placing said photoresist layer in contact with an immersion fluid and exposing said photoresist layer to actinic radiation through a patterned photomask, said immersion fluid contacting said tapered annular region during said exposing said photoresist layer to actinic radiation through a patterned photomask; and
    performing an additional developing of said photoresist layer to transfer said pattern on said patterned photomask to said photoresist layer by removal of regions of said photoresist layer.

16. The method of claim 15, said exposing said photoresist layer to actinic radiation through a patterned photomask includes:
    moving said substrate and said photo mask over said photoresist layer while said photoresist layer is in contact with said immersion fluid.

* * * * *